US010652486B2

(12) United States Patent
Mandelli et al.

(10) Patent No.: US 10,652,486 B2
(45) Date of Patent: May 12, 2020

(54) IMAGE SENSOR WITH ELECTRON AND HOLE COLLECTION ELECTRODES

(71) Applicant: INVISAGE TECHNOLOGIES, INC., Newark, CA (US)

(72) Inventors: Emanuele Mandelli, Mountain View, CA (US); Zachary M. Beiley, Oakland, CA (US); Nikolai E. Bock, San Jose, CA (US)

(73) Assignee: INVISAGE TECHNOLOGIES, INC., Newark, CA (US)

( * ) Notice: Subject to any disclaimer, the term of this patent is extended or adjusted under 35 U.S.C. 154(b) by 0 days.

(21) Appl. No.: 16/341,898

(22) PCT Filed: Oct. 19, 2017

(86) PCT No.: PCT/US2017/057283
§ 371 (c)(1),
(2) Date: Apr. 14, 2019

(87) PCT Pub. No.: WO2018/075705
PCT Pub. Date: Apr. 26, 2018

(65) Prior Publication Data
US 2019/0246051 A1     Aug. 8, 2019

Related U.S. Application Data

(60) Provisional application No. 62/410,795, filed on Oct. 20, 2016.

(51) Int. Cl.
*H04N 5/355* (2011.01)
*H01L 27/146* (2006.01)

(52) U.S. Cl.
CPC ....... *H04N 5/355* (2013.01); *H01L 27/14603* (2013.01); *H01L 27/14609* (2013.01); *H01L 27/14643* (2013.01); *H01L 27/14665* (2013.01)

(58) Field of Classification Search
None
See application file for complete search history.

(56) References Cited

U.S. PATENT DOCUMENTS

| 5,683,595 A | 11/1997 | Nagamachi |
| 5,889,313 A | 3/1999 | Parker |

(Continued)

FOREIGN PATENT DOCUMENTS

| WO | 03067663 A1 | 8/2003 |
| WO | 2007102051 A2 | 9/2007 |
| WO | 2009071587 A1 | 6/2009 |

OTHER PUBLICATIONS

Nishimura et al., "An Over 120dB Simultaneous-Capture Wide-Dynamic-Range 1.6e—Ultra-Low-Reset-Noise Organic-Photoconductive-Film CMOS Image Sensor", IEEE International Solid-State Circuits Conference (ISSCC'16), session 6, pp. 110-111, year 2016.

(Continued)

*Primary Examiner* — James M Hannett
(74) *Attorney, Agent, or Firm* — Kligler & Associates Patent Attorneys Ltd (57) ABSTRACT

Imaging apparatus (100, 200, 300) includes a photosensitive medium (302) configured to convert incident photons into pairs of electrons and holes. An array of pixel circuits (304) is formed on a semiconductor substrate (305). Each pixel circuit defines a respective pixel and includes an electron-collecting electrode (306, 502) in contact with the photosensitive medium at a first location in the pixel and a hole-collecting electrode (308, 504) in contact with the photosensitive medium at a second location in the pixel. Circuitry (800, 1000) is coupled to apply a positive potential to and collect the electrons from the electron-collecting electrode and to apply a negative potential to and collect the holes from the hole-collecting electrode and to output a (Continued)

signal indicative of an intensity of the incident photons responsively to the collected electrons and holes.

12 Claims, 8 Drawing Sheets

(56) References Cited

U.S. PATENT DOCUMENTS

| | | | |
|---|---|---|---|
| 6,026,964 | A | 2/2000 | Hook et al. |
| 6,943,409 | B1 | 9/2005 | Cheng et al. |
| 7,470,965 | B2 | 12/2008 | Kuriyama |
| 7,923,801 | B2 | 4/2011 | Tian et al. |
| 8,120,028 | B2 | 2/2012 | Tung et al. |
| 8,222,709 | B2 | 7/2012 | Oike et al. |
| 8,304,707 | B2 | 11/2012 | Lee et al. |
| 8,354,693 | B2 | 1/2013 | Mori et al. |
| 8,704,281 | B2 | 4/2014 | Maehara et al. |
| 8,822,897 | B2 * | 9/2014 | Tian .................. H01L 27/14603 250/208.1 |
| 9,941,316 | B2 | 4/2018 | Sargent et al. |
| 9,972,652 | B2 | 5/2018 | Sargent et al. |
| 9,972,653 | B2 | 5/2018 | Tian et al. |
| 2007/0029581 | A1 * | 2/2007 | Adkisson .......... H01L 27/14603 257/233 |
| 2010/0038523 | A1 | 2/2010 | Venezia et al. |
| 2011/0226934 | A1 | 9/2011 | Tian et al. |

OTHER PUBLICATIONS

International Application PCT/US2017/057283 Search report dated Jan. 31, 2018.
U.S. Appl. No. 15/939,331 office action dated May 24, 2019.

\* cited by examiner

IMAGE SENSOR WITH ELECTRON AND HOLE COLLECTION ELECTRODES

CROSS-REFERENCE TO RELATED APPLICATION

This application claims the benefit of U.S. Provisional Patent Application 62/410,795, filed Oct. 20, 2016, which is incorporated herein by reference.

FIELD OF THE INVENTION

The present invention relates generally to image sensing devices, and particularly to circuits and methods for enhancing the performance of film-based image sensors.

BACKGROUND

In film-based image sensors, a silicon-based switching array is overlaid with a photosensitive film such as a film containing a dispersion of quantum dots. Films of this sort are referred to as "quantum films." The switching array, which can be similar to those used in complementary metal-oxide sandwich (CMOS) image sensors that are known in the art, is coupled by suitable electrodes to the film in order to read out the photocharge that accumulates in each pixel of the film due to incident light.

U.S. Pat. No. 7,923,801, whose disclosure is incorporated herein by reference, describes materials, systems and methods for optoelectronic devices based on such quantum films.

SUMMARY

Embodiments of the present invention that are described hereinbelow provide enhanced image sensor designs and methods for operation of image sensors with enhanced performance.

There is therefore provided, in accordance with an embodiment of the invention, imaging apparatus, including a photosensitive medium configured to convert incident photons into pairs of electrons and holes. An array of pixel circuits is formed on a semiconductor substrate. Each pixel circuit defining a respective pixel and includes an electron-collecting electrode in contact with the photosensitive medium at a first location in the pixel and a hole-collecting electrode in contact with the photosensitive medium at a second location in the pixel. The pixel circuits include circuitry coupled to apply a positive potential to and collect the electrons from the electron-collecting electrode and to apply a negative potential to and collect the holes from the hole-collecting electrode and to output a signal indicative of an intensity of the incident photons responsively to the collected electrons and holes.

In a disclosed embodiment, the photosensitive medium includes a quantum film.

In some embodiments, the apparatus includes a common electrode, which is at least partially transparent, overlying the photosensitive medium and is biased at a voltage between the positive potential applied to the electron-collecting electrode and the negative potential applied to the hole-collecting electrode.

Additionally or alternatively, the electron-collecting electrode and the hole-collecting electrode extend through the photosensitive medium.

In some embodiments, the circuitry in each pixel circuit includes a first charge store coupled to collect the electrons from the electron-collecting electrode and a second charge store coupled to collect the holes from the hole-collecting electrode and is configured to output the signal as a differential output between the first and second charge stores.

Alternatively, the circuitry is configured to collect the holes with a first conversion gain and to collect the electrons with a second conversion gain, which is different from the first conversion gain, and to output the signal with a dynamic range that is enhanced responsively to a relation between the first and second conversion gains. In a disclosed embodiment, the apparatus includes a column circuit, which is configured to generate a first digital signal corresponding to the collected electrons and a second digital signal corresponding to the collected holes, and to select one of the first and second digital signals to produce a digital output signal with the enhanced dynamic range.

There is also provided, in accordance with an embodiment of the invention, a method for imaging, which includes coupling an array of pixel circuits formed on a semiconductor substrate to a photosensitive medium configured to convert incident photons into pairs of electrons and holes. Each pixel circuit defines a respective pixel and includes an electron-collecting electrode in contact with the photosensitive medium at a first location in the pixel and a hole-collecting electrode in contact with the photosensitive medium at a second location in the pixel. A positive potential is applied in each pixel to the electron-collecting electrode and a negative potential is applied to the hole-collecting electrode. In each pixel the electrons are collected from the electron-collecting electrode and the holes from the hole-collecting electrode, and a signal is output indicative of an intensity of the incident photons responsively to the collected electrons and holes.

The present invention will be more fully understood from the following detailed description of the embodiments thereof, taken together with the drawings in which:

DETAILED DESCRIPTION OF EMBODIMENTS

System Overview

Figure 1:
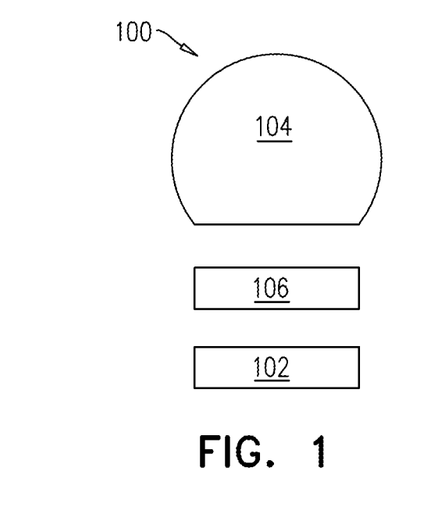
FIG. 1 is a schematic side view of a camera module, which is operative in accordance with an embodiment of the invention.

The image sensors described herein may be used within any suitable imaging device, such as a camera, spectrometer, light sensor, or the like. FIG. 1 shows one example of a camera module 100 that may utilize an image sensor 102, which may be configured in any manner as described below. The camera module 100 may comprise a lens system 104, which may direct and focus incoming light onto image sensor 102. While depicted in FIG. 1 as a single element, it should be appreciated that lens system 104 may actually include a plurality of lens elements, some or all of which may be fixed relative to each other (e.g., via a lens barrel or the like). The camera module 102 may optionally be configured to move the lens system 104 and/or the image sensor 102 to perform autofocus and/or optical image stabilization.

The camera module may further comprise one or more optional filters, such as a filter 106, which may be placed along the optical path. Filter 106 may reflect or otherwise block certain wavelengths of light, and may substantially prevent, based on the effectiveness of the filter, these wavelengths of light from reaching the image sensor 102. As an example, when an image sensor is configured to measure visible light, filter 106 may comprise an infrared cutoff filter. While shown in FIG. 1 as being positioned between image sensor 102 and lens system 104, filter 106 may be positioned to cover lens system 104 (relative to incoming light) or may be positioned between lenses of lens system 104.

Figure 2:
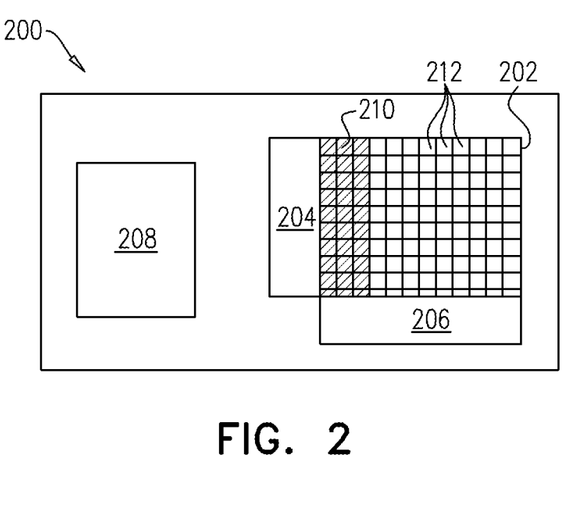
FIG. 2 is a schematic top view of an example image sensor, in accordance with an embodiment of the invention.

FIG. 2 shows a top view of an exemplary image sensor 200 as described herein. Image sensor 200 may comprise an imaging area comprising a pixel array 202, which may include a first plurality of pixels 212 that may be used to convert incident light into electrical signals. In some instances, pixel array 202 may comprise an obscured region 210 including at least one pixel (e.g., a second plurality of pixels) that is obscured relative to incoming light (e.g., covered by a light-blocking layer). Electrical signals may still be read out from some or all of these pixels, but since there is ideally no light reaching these pixels, the current measured from these pixels may represent the dark current associated with one or more components of the image sensor. Image sensor 200 (or associated processing circuitry) may compensate for the dark current levels during image capture and/or processing.

Image sensor 200 may further comprise row circuitry 204 and column circuitry 206, which collectively may be used to convey various signals (e.g., bias voltages, reset signals) to individual pixels as well as to read out signals from individual pixels. For example, row circuitry 204 may be configured to simultaneously control multiple pixels in a given row, while column circuitry 206 may convey pixel electrical signals to other circuitry for processing. Accordingly, image sensor 200 may comprise control circuitry 208, which may control the row circuitry 204 and column circuitry 206, as well as performing input/output operations (e.g., parallel or serial IO operations) for image sensor 200. The control circuitry may include a combination of analog circuits (e.g., circuits to provide bias and reference levels) and digital circuits (e.g., image enhancement circuitry, line buffers to temporarily store lines of pixel values, register banks that control global device operation and/or frame format).

Figure 3:
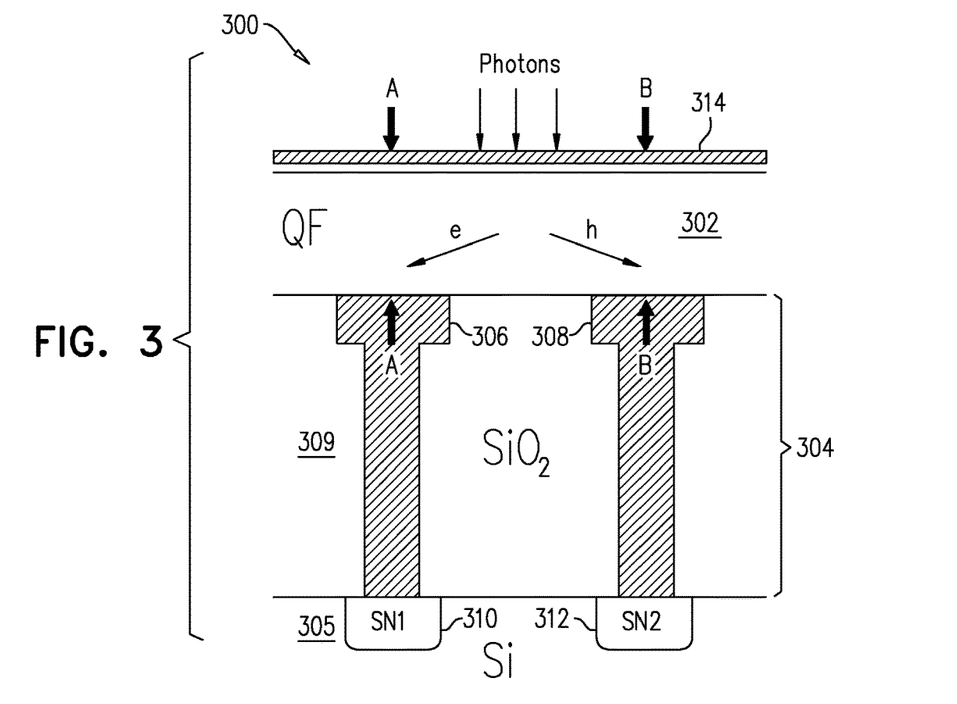
FIG. 3 is a schematic sectional illustration of a pixel in an image sensor, in accordance with an embodiment of the invention.

FIG. 3 is a schematic sectional illustration of a pixel 300 in an image sensor, such as image sensor 200, in accordance with an embodiment of the invention. Pixel 300 shows a single example, which is typically replicated over the entire array of pixels in the image sensor.

Pixel 300 comprises a photosensitive medium, such as a quantum film 302, which converts incident photons into pairs of electrons (e) and holes (h). An array of pixel circuits 304, formed on a semiconductor substrate 305, such as a silicon wafer, defines an array of pixels in film 302. Pixel circuit 304 comprises an electron-collecting electrode 306 and a hole-collecting electrode 308 in contact with film 302 at different, respective locations in pixel 300. Electrodes 306 and 308 may be surrounded by an insulating layer 309, such as a layer of $SiO_2$. This pixel configuration differs from image sensors that are known in the art, in which only electrons or only holes are collected, while the other type of charge carriers (holes or electrons, as the case may be) are drained into the power supply. Separate collection of both types of charge carriers, as provided by embodiments of the present invention, enables pixel 300 to sense incident light intensity with enhanced signal/noise ratio and dynamic range.

Pixel circuit 304 further comprises circuitry coupled to apply a positive potential to and collect the electrons from electron-collecting electrode 306 via a sense node (SN1) 310, and to apply a negative potential to and collect the holes from hole-collecting electrode 308 via a sense node (SN2) 312. The sense nodes and associated circuitry, as shown in greater detail in the figures that follow, are typically formed on substrate 305, for example by a CMOS process. In the present embodiment, an additional common electrode 314, which is at least partially transparent, overlies film 302 and is biased at a voltage between the positive potential applied to electron-collecting electrode 306 and the negative potential applied to hole-collecting electrode 308. Sense nodes 310 and 312 serve as charge stores for the collected electrons and holes, respectively. Based on the electrons and holes collected at sense nodes 310 and 312, pixel circuit 304 outputs a signal indicative of the intensity of the incident photons on film 302 in pixel 300.

The terms "positive" and "negative" in reference to the potentials applied to electrodes 306 and 308 are used in a relative sense, i.e., "positive" simply means higher than some baseline, while "negative" means lower than the baseline. The baseline voltage may be, for instance, the bias that is applied to common electrode 314, as illustrated in the example shown in FIG. 4.

Figure 4:
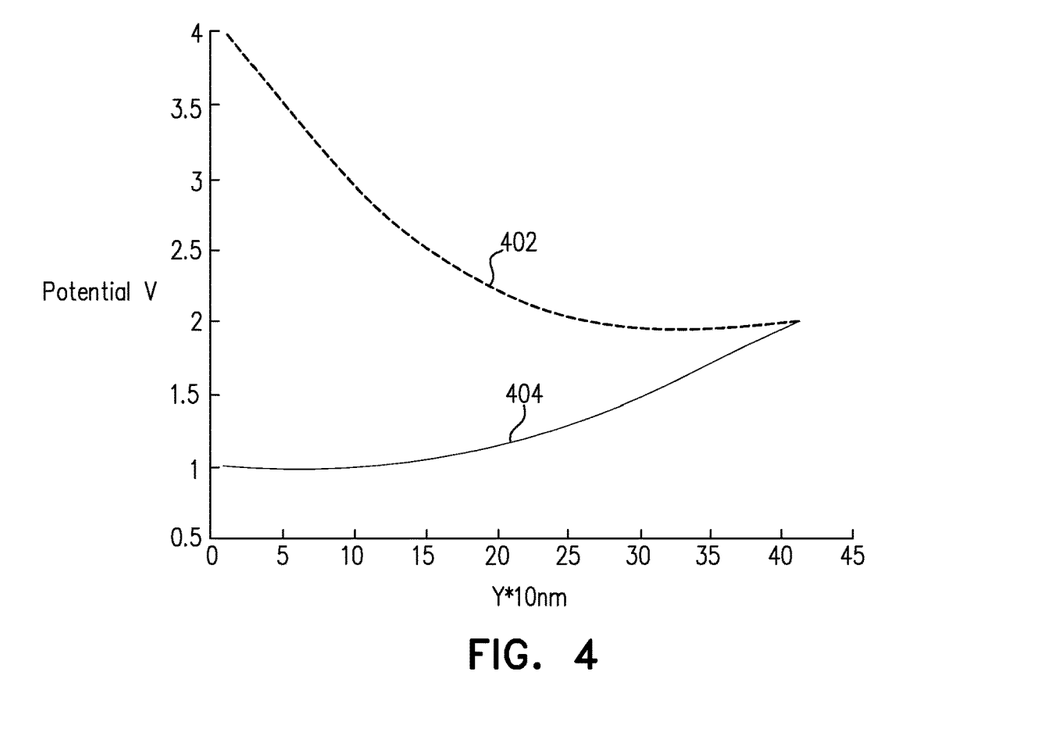
FIG. 4 is a plot that schematically illustrates the electrical potential distribution in a quantum film along two vertical section lines in FIG. 3, in accordance with an embodiment of the invention.

FIG. 4 is a plot that schematically illustrates the electrical potential distribution in quantum film 302 along two vertical section lines in FIG. 3, in accordance with an embodiment of the invention. A curve 402 shows the potential distribution along line A-A, above electron-collection electrode 306; while a curve 404 shows the potential distribution along line B-B, above hole-collecting electrode 308. In this example, a bias of 1 volt is applied to hole-collection electrode 308; a bias of 2 volts is applied to common electrode 314; and a bias of 4 volts is applied to electron-collection electrode 306.

Figure 5:
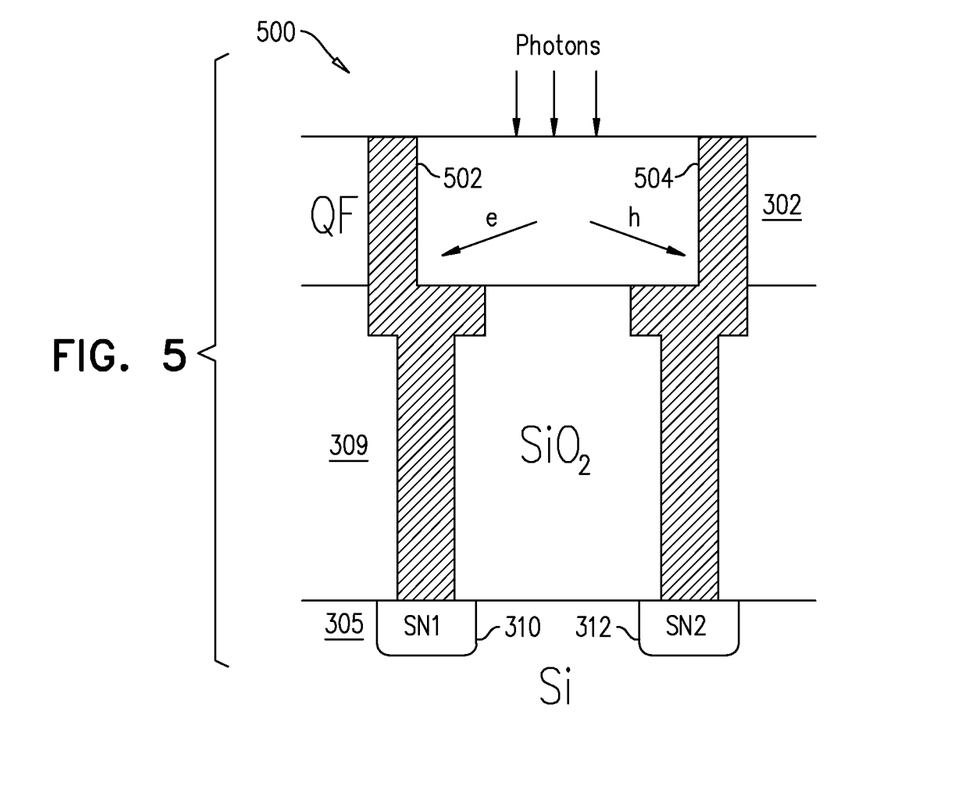
FIG. 5 is a schematic sectional illustration of a pixel in an image sensor, in accordance with an alternative embodiment of the invention.

FIG. 5 is a schematic sectional illustration of a pixel 500 in an image sensor, in accordance with an alternative embodiment of the invention. Pixel 500 is similar in structure and operation to pixel 300, as described above, and elements of pixel 500 are labeled with the same reference numbers as corresponding elements of pixel 300. Pixel 500 differs from the preceding embodiment, however, in that an electron-collection electrode 502 and a hole-collection electrode 504 extend upward through quantum film 302. Electrodes 502 and 504 may be formed, for example, by buildup of copper or aluminum dividers above the sorts of electrodes that are shown in FIG. 3. These dividers are useful in avoiding "dead zones" and crosstalk between pixels that could otherwise occur at the top of quantum film 302, where the electrical potential drops (as can be seen at the right side of FIG. 4).

Figure 6:
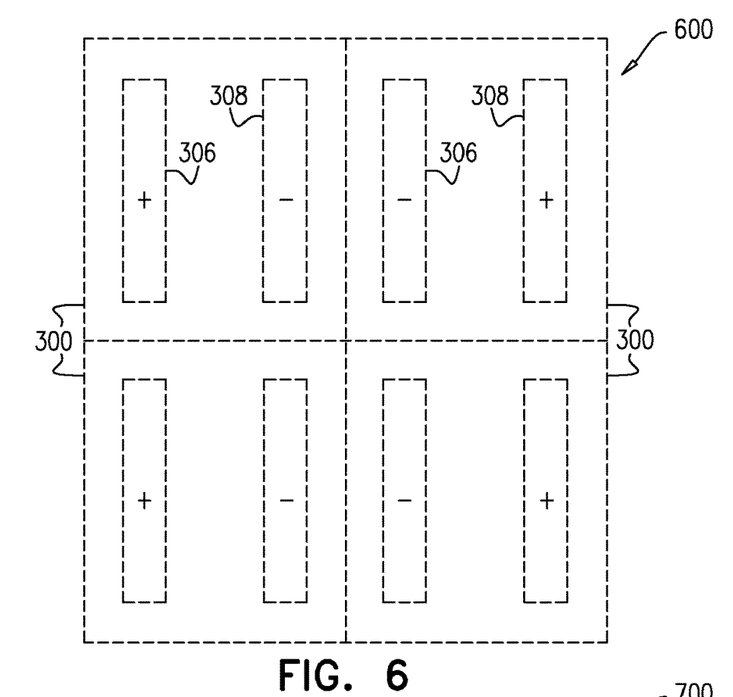
FIGS. 6 and 7 are schematic top views of image sensing arrays, in accordance with embodiments of the invention.
Figure 7:
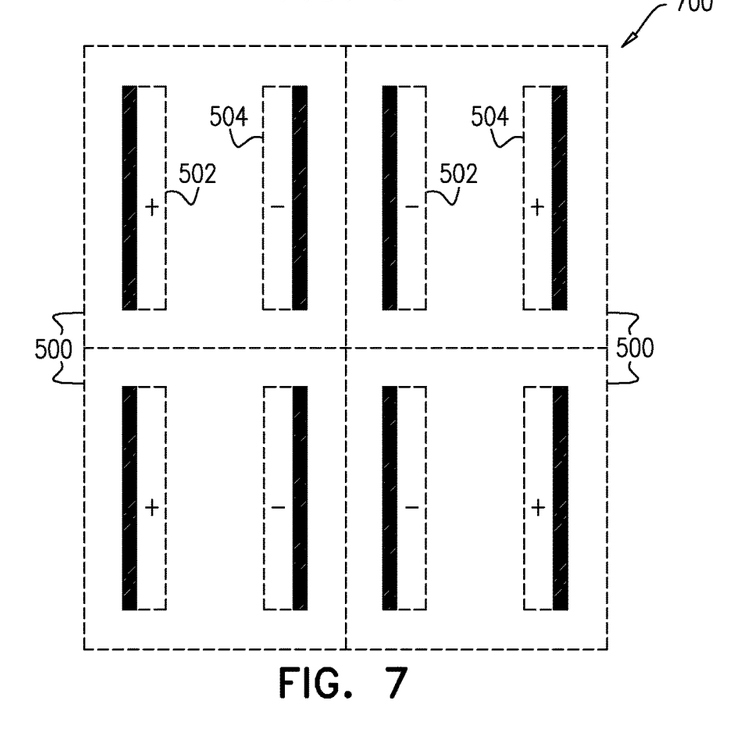

FIGS. 6 and 7 are schematic top views of image sensing arrays 600 and 700, made up of pixels 300 and 500, respectively, in accordance with embodiments of the invention. Each drawing includes four neighboring pixels. Electrodes 306 and 308, which contact the bottom side of film 302, are shown in FIG. 6 by dashed lines. FIG. 7 shows electrodes 502 and 504, which extend through to the top of film 302.

Figure 8:
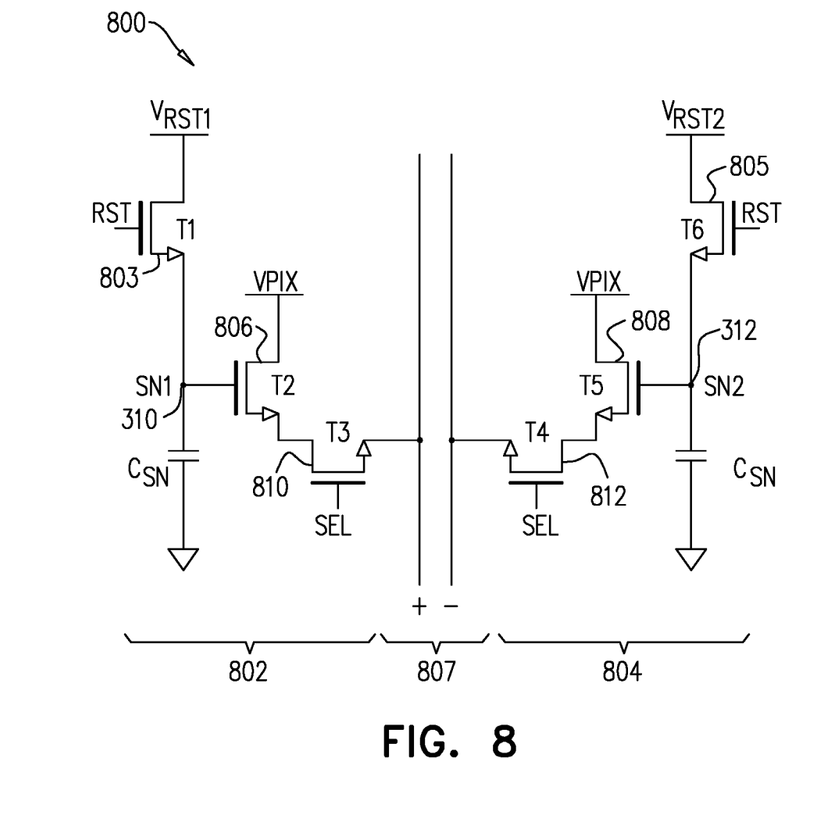
FIG. 8 is an electrical circuit diagram, which schematically illustrates elements of a pixel circuit, in accordance with an embodiment of the invention.

FIG. 8 is an electrical circuit diagram, which schematically illustrates elements of a pixel circuit 800, in accordance with an embodiment of the invention. Circuit 800 can be used in pixel 300, as a part of pixel circuit 304, or in pixel 500, and outputs a differential signal output based on the charges stored by sense nodes 310 and 312, due to collected electrons and holes, respectively. More specifically, pixel circuit 800 comprises an electron readout circuit 802 and a hole readout circuit 804, which are coupled across a differential read bus 807.

Circuits 802 and 804 comprise respective reset transistors 803 and 805 and source-follower transistors 806 and 808. The reset voltage $V_{RST1}$ for electron readout circuit 802 is low, while the reset voltage $V_{RST2}$ for hole readout circuit 804 is high. Pixel readout starts when respective select transistors 810 and 812 are switched on, thus connecting source-follower transistors 806 and 808 to read bus 807. The resulting differential output has a signal level twice that of a single-ended readout, as well as inherent cancellation of row noise.

Figure 9:
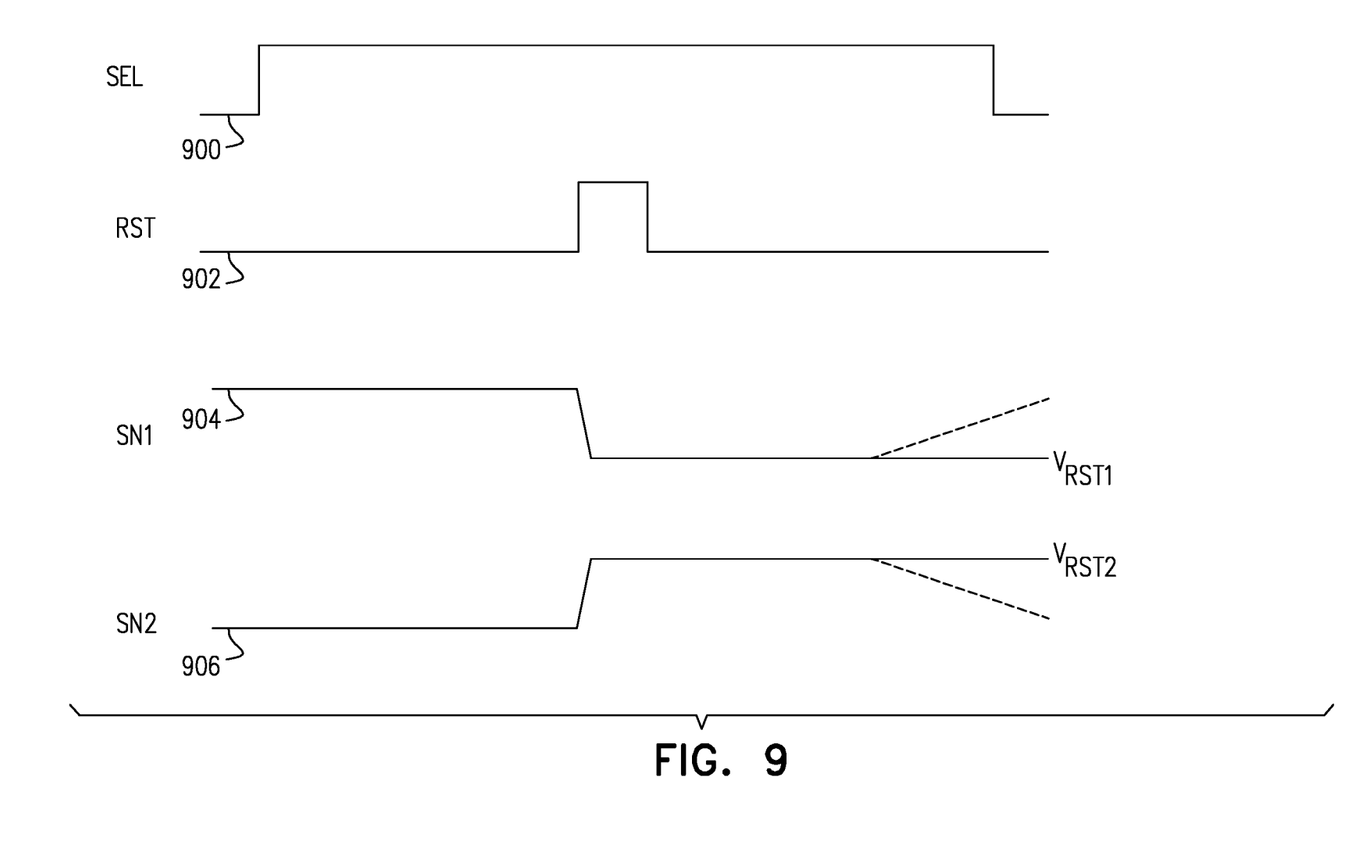
FIG. 9 is a signal timing diagram that schematically illustrates signals in the pixel circuit of FIG. 8, in accordance with an embodiment of the invention.

FIG. 9 is a signal timing diagram that schematically illustrates signals in pixel circuit 800, in accordance with an embodiment of the invention. Pixel readout begins when a select signal 900 to transistors 810 and 812 goes high, thus switching on the transistors. Read bus 807 now receives signals 904 and 906 from sense nodes 310 and 312, giving a differential readout on the bus equal to the sum of the individual amplitudes of signals 904 and 906. A reset pulse 902 is applied to transistors 803 and 805, causing the level of signal 904 to drop and that of signal 906 to increase. Bus 807 outputs the differential signal level after the reset pulse. The row noise appears as a common-mode signal and is thus rejected by the differential readout. Following the reset pulse, the levels of signals 904 and 906 may once again grow as further electrons and holes accumulate, as illustrated by the dashed lines at the right side of the figure.

Figure 10:
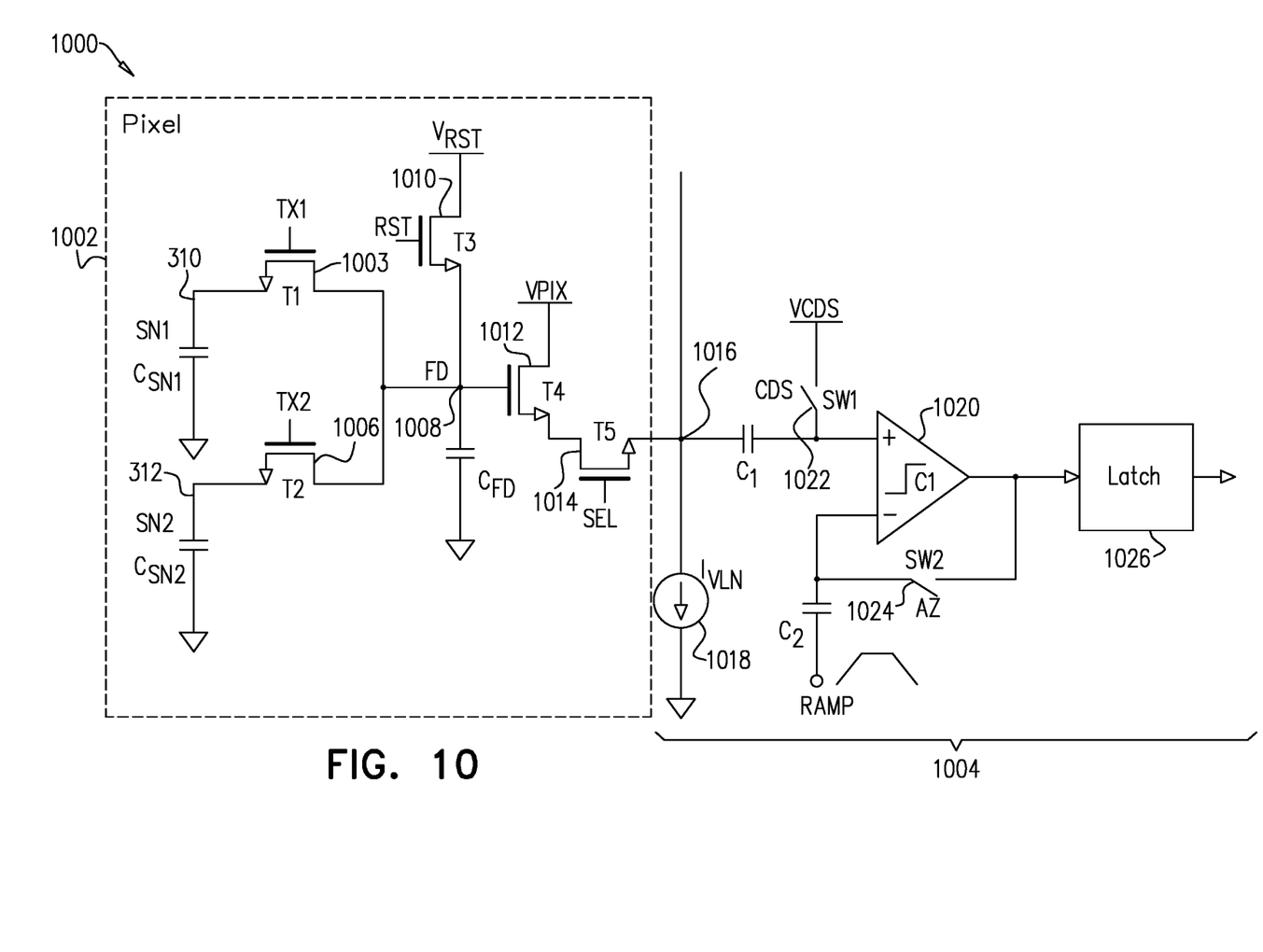
FIG. 10 is an electrical circuit diagram, which schematically illustrates elements of pixel readout circuitry, in accordance with an embodiment of the invention.

FIG. 10 is an electrical circuit diagram, which schematically illustrates elements of pixel readout circuitry 1000, in accordance with an alternative embodiment of the invention. Circuitry 1000 comprises a pixel circuit 1002, which can be used in pixel 300, as a part of pixel circuit 304, or in pixel 500, to output a signal with extended dynamic range. The signal is read out and digitized by a column circuit 1004, which in this implementation includes a dual-slope analog-to-digital converter (ADC).

In this embodiment, sense nodes 310 (SN1) and 312 (SN2) are assumed to have different conversion gains. For example, SN1, as the electron collection node, may have high conversion gain, while SN2, as the hole collection node, has a lower conversion gain. Alternatively, it may be possible to configure the hole collection node with a higher conversion gain than the electron collection node. The conversion gains depend on the equivalent capacitances of the sense nodes and may be adjusted by increasing or decreasing the respective capacitance.

Circuitry 1000 outputs a signal that is indicative of the intensity of light that is incident on the pixel, with a dynamic range that is enhanced by a factor based on the relation (ratio or difference) between the first and second conversion gains.

Specifically, in the configuration shown in FIG. 10, column circuit 1004 generates a first digital input signal corresponding to the electrons collected by sense node 310 and a second digital input signal corresponding to the holes collected by sense node 312. The digital input signals can be output selectively, using the high-gain signal when incident light intensity is low and the low-gain signal when incident light intensity is high, causing the high-gain signal to saturate. Column circuit 1004 thus produces a digital output signal with enhanced dynamic range. Details of this process are described below.

Pixel circuit 1002 comprises transfer gates (T1, T2) 1003 and 1006, which are respectively coupled between sense nodes 310 and 312 and an FD node 1008. A reset transistor (T3) 1010 resets node 1008 to the reset voltage $V_{RST}$. A source follower transistor (T4) 1012 and row select transistor (T5) 1014 couple FD node 1008 to a column input 1016.

Column circuit 1004 comprises a source follower current source ($I_{VLN}$) 1018 and a comparator 1020. Column input 1016 is coupled to the positive input of comparator 1020 via a capacitor C1, while a ramp input is coupled to the negative input of the comparator via a capacitor C2. The inputs to comparator 1020 are controlled by a correlated double-sampling (CDS) switch 1022 (SW1) and an auto-zero (AZ) switch 1024 (SW2). The output of the comparator drives a latch 1026, which captures a digital value corresponding to the time at which the ramp voltage on the negative input to the comparator is equal to the voltage at column input 1016. The operation of these elements is further described below.

Figure 11:
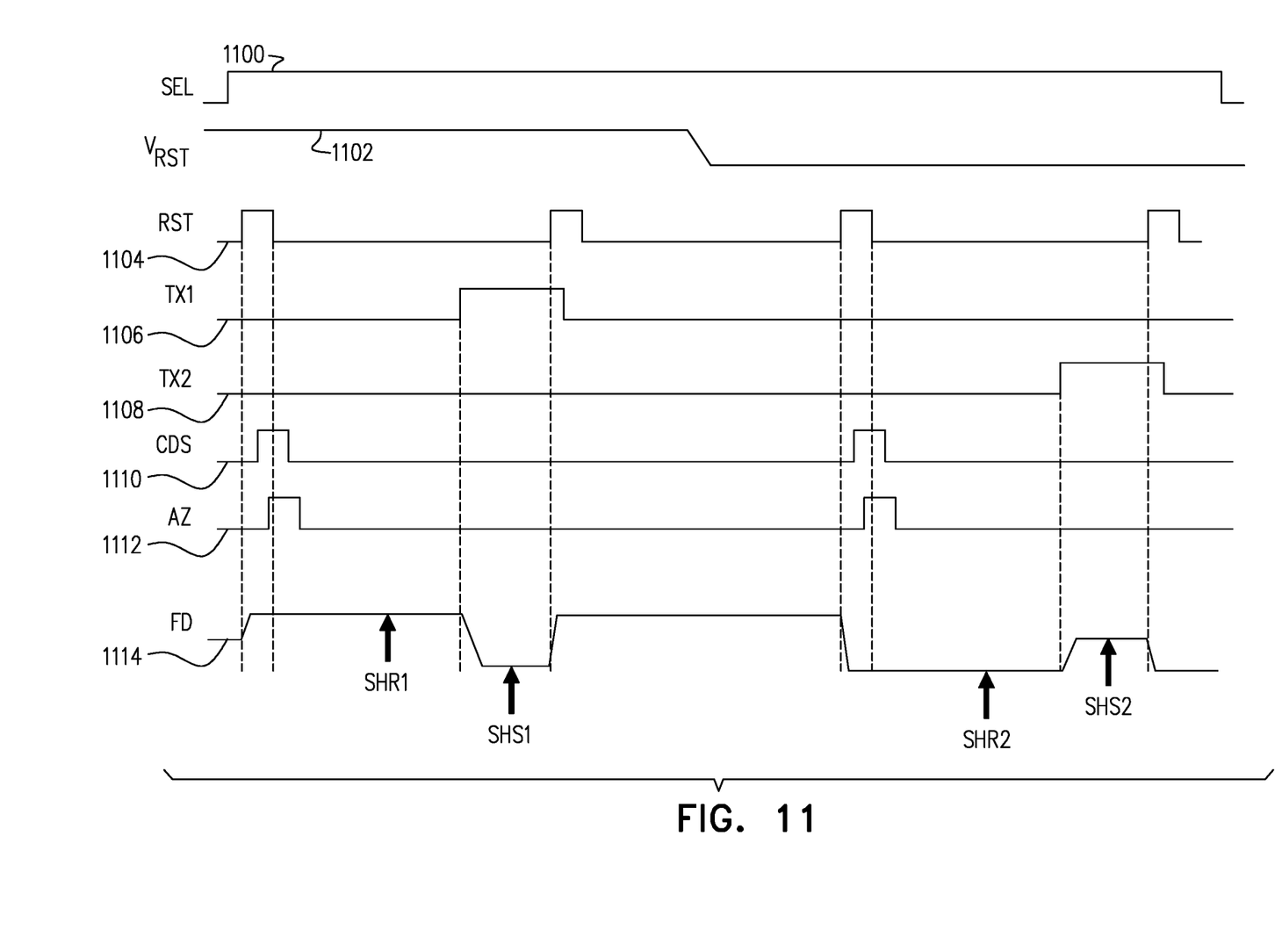
FIG. 11 is a signal timing diagram that schematically illustrates signals used in reading out accumulated charge in the circuitry of FIG. 10, in accordance with an embodiment of the invention.

FIG. 11 is a signal timing diagram that schematically illustrates signals used in reading out the accumulated charge from pixel circuit 1002 via column circuit 1004, in accordance with an embodiment of the invention. Readout starts with assertion of a select (SEL) signal 1100 to a high level on row select transistor 1014, thus connecting source follower transistor 1012 to column input 1016. A reset voltage ($V_{RST}$) 1102 is held initially at a high level $V_{RST1}$. Applying a reset signal 1104 to reset transistor 1010 resets FD node 1008 to the high voltage level $V_{RST1}$, as shown by an FD signal 1114. This reference level of FD signal 1114 is labeled "SHR1." Transfer signals 1106 (TX1) and 1108 (TX2) remain low, so that transfer gates 1003 and 1006 are closed.

Following reset signal 1104, a CDS signal 1110 and an AZ signal 1112 are applied to switches 1022 and 1024, respectively. The left plate of capacitor C1 is thus charged to the high reset level $V_{RST1}$, while the right plate of capacitor C1 is charged to VCDS, as is the top plate of capacitor C2. Switches 1022 and 1024 are then opened before signal transfer, causing the inputs to comparator 1020 to float.

Transfer signal 1106 (TX1) is now asserted high, and the electron signal charge is transferred from sense node 310 via transfer gate 1003 into FD node 1008. $V_{RST1}$ is set to a level much higher than the potential under transfer gate 1003, so that there is no charge sharing between sense node 310 and FD node 1008. FD signal 1114 accordingly drops to the electron signal level marked "SHS1" in FIG. 11. The positive input of comparator 1020 senses the difference between the previous reset and the current signal level and converts the difference to a digital value on the downward ramp of the ramp signal applied to capacitor C2.

To reset sense node 310, reset signal 1104 to reset transistor 1010 is again set high, while transfer gate 1003 remains open. This reset will resolve any overflow at FD node 1008. The electron noise of the first readout phase, as described above, is determined by kTC and given by:

$$N_{ns} = \sqrt{(k*T*C_{FD})}, \quad (1)$$

wherein k is Boltzmann's constant and T is temperature. The kTC noise at sense node 310 can be reduced by a soft reset of the sense node, while the kTC noise at FD node 1008 is cancelled by correlated double-sampling.

In the next phase, the hole signal charge at sense node 312 (SN2) is read out in similar fashion. As the first step, FD node 1008 is reset to the low voltage level $V_{RST2}$, giving the low reference value "SHR2" of FD signal 1114. CDS and AZ signals 1110 and 1112 are asserted as in the first phase. The left plate of capacitor C1 is thus charged to the low reset level, after which the FD signal goes up after charge transfer through transfer gate 1006, giving the hole signal level "SHS2." ADC conversion is done in this phase on the upward ramp. Subsequent processing can use the resulting hole signal level if the electron signal level is saturated.

Dynamic range extension is determined by the ratio of the electron and hole conversion gains. The high conversion gain (in this case of electron collection) is given by:

$$CG_H = q/C_{FD}, \quad (2)$$

wherein q is the elementary charge. The row conversion gain is given by:

$$CG_L = q/(C_{SN2} + C_{FD}) \quad (3)$$

The pixel dynamic range is then given by:

$$DR = 20*\log(N_{max}/N_{sn}) \quad (4)$$

wherein $N_{max}$ is the maximum electron charge capacity and $N_{sn}$ is the noise electron charge. Assuming dV=1 volt swing at the pixel output, $N_{max}$ is given by:

$$N_{max} = dV/CG_H = 1/CG_H \quad (5)$$

$N_{sn}$ can be nine electrons for $C_{FD} = 0.5$ fF.

$C_{SN2}$ is determined by the pixel size and the dielectric constant of the capacitor. A metal-insulator-metal (MIM) capacitor can have a capacitance up to 18 fF/μm² when a high-K dielectric is used. In this extreme case, a pixel with a pitch of 2 μm can have $C_{SN2}$ of about 18 fF, which is equivalent a capacity of 125K electrons (assuming 1V swing at pixel output) and 83 dB dynamic range.

Although the embodiments described above relate mainly to film-based image sensors, the principles of these embodiments may similarly be applied, mutatis mutandis, in image sensors of other types, using other sorts of photosensitive media. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Imaging apparatus, comprising:
    a photosensitive medium configured to convert incident photons into pairs of electrons and holes; and
    an array of pixel circuits formed on a semiconductor substrate, each pixel circuit defining a respective pixel and comprising:
        an electron-collecting electrode in contact with the photosensitive medium at a first location in the pixel;
        a hole-collecting electrode in contact with the photosensitive medium at a second location in the pixel;
        circuitry coupled to apply a positive potential to and collect the electrons from the electron-collecting electrode and to apply a negative potential to and collect the holes from the hole-collecting electrode and to output a signal indicative of an intensity of the incident photons responsively to the collected electrons and holes; and
    a common electrode, which is at least partially transparent, overlying the photosensitive medium, and is biased at a voltage between the positive potential applied to the electron-collecting electrode and the negative potential applied to the hole-collecting electrode.

2. The apparatus according to claim 1, wherein the photosensitive medium comprises a quantum film.

3. Imaging apparatus, comprising:
    a photosensitive medium configured to convert incident photons into pairs of electrons and holes; and
    an array of pixel circuits formed on a semiconductor substrate, each pixel circuit defining a respective pixel and comprising:
        an electron-collecting electrode in contact with the photosensitive medium at a first location in the pixel;
        a hole-collecting electrode in contact with the photosensitive medium at a second location in the pixel,
        wherein the electron-collecting electrode and the hole-collecting electrode extend through the photosensitive medium; and
        circuitry coupled to apply a positive potential to and collect the electrons from the electron-collecting electrode and to apply a negative potential to and collect the holes from the hole-collecting electrode and to output a signal indicative of an intensity of the incident photons responsively to the collected electrons and holes.

4. The apparatus according to claim 1, wherein the circuitry in each pixel circuit comprises a first charge store coupled to collect the electrons from the electron-collecting electrode and a second charge store coupled to collect the holes from the hole-collecting electrode and is configured to output the signal as a differential output between the first and second charge stores.

5. Imaging apparatus, comprising:
    a photosensitive medium configured to convert incident photons into pairs of electrons and holes; and
    an array of pixel circuits formed on a semiconductor substrate, each pixel circuit defining a respective pixel and comprising:
        an electron-collecting electrode in contact with the photosensitive medium at a first location in the pixel;
        a hole-collecting electrode in contact with the photosensitive medium at a second location in the pixel; and
        circuitry coupled to apply a positive potential to and collect the electrons from the electron-collecting electrode and to apply a negative potential to and collect the holes from the hole-collecting electrode and to output a signal indicative of an intensity of the incident photons responsively to the collected electrons and holes, wherein the circuitry is configured to collect the holes with a first conversion gain and to collect the electrons with a second conversion gain, which is different from the first conversion gain, and to output the signal with a dynamic range that is enhanced responsively to a relation between the first and second conversion gains.

6. The apparatus according to claim 5, and comprising a column circuit, which is configured to generate a first digital signal corresponding to the collected electrons and a second digital signal corresponding to the collected holes, and to select one of the first and second digital signals to produce a digital output signal with the enhanced dynamic range.

7. A method for imaging, comprising:
coupling an array of pixel circuits formed on a semiconductor substrate to a photosensitive medium configured to convert incident photons into pairs of electrons and holes, each pixel circuit defining a respective pixel and comprising an electron-collecting electrode in contact with the photosensitive medium at a first location in the pixel and a hole-collecting electrode in contact with the photosensitive medium at a second location in the pixel;
applying in each pixel a positive potential to the electron-collecting electrode and a negative potential to the hole-collecting electrode;
collecting in each pixel the electrons from the electron-collecting electrode and the holes from the hole-collecting electrode, and outputting a signal indicative of an intensity of the incident photons responsively to the collected electrons and holes; and
overlaying a common electrode, which is at least partially transparent, on the photosensitive medium, and biasing the common electrode at a voltage between the positive potential applied to the electron-collecting electrode and the negative potential applied to the hole-collecting electrode.

8. The method according to claim 7, wherein the photosensitive medium comprises a quantum film.

9. The method according to claim 7, wherein the electron-collecting electrode and the hole-collecting electrode extend through the photosensitive medium.

10. The method according to claim 7, wherein outputting the signal comprises generating a differential output responsively to the collected electrons and the collected holes.

11. The method according to claim 7, wherein collecting the electrons and the holes comprises collecting the holes with a first conversion gain and collecting the electrons with a second conversion gain, which is different from the first conversion gain, and wherein outputting the signal comprises generating the signal with a dynamic range that is enhanced responsively to a relation between the first and second conversion gains.

12. The method according to claim 11, wherein generating the signal comprises generating a first digital signal corresponding to the collected electrons and generating a second digital signal corresponding to the collected holes, and selecting one of the first and second digital signals to produce a digital output signal with the enhanced dynamic range.

* * * * *